United States Patent [19]
Farnworth et al.

[11] Patent Number: 5,801,452
[45] Date of Patent: Sep. 1, 1998

[54] MULTI CHIP MODULE INCLUDING SEMICONDUCTOR WAFER OR DICE, INTERCONNECT SUBSTRATE, AND ALIGNMENT MEMBER

[75] Inventors: Warren M. Farnworth, Nampa; Salman Akram, Boise, both of Id.

[73] Assignee: Micron Technology, Inc., Boise, Id.

[21] Appl. No.: 736,998

[22] Filed: Oct. 25, 1996

[51] Int. Cl.⁶ ............... G01R 1/02; H05K 3/02; H01L 23/34
[52] U.S. Cl. ............................................. 257/797
[58] Field of Search .................. 257/797, 778, 257/712, 718, 713, 719, 726, 620, 727; 324/755, 765, 754; 29/832, 840

[56] References Cited

U.S. PATENT DOCUMENTS

| | | | |
|---|---|---|---|
| 4,000,509 | 12/1976 | Jarvela | 257/726 |
| 5,123,850 | 6/1992 | Elder et al. | 439/67 |
| 5,140,405 | 8/1992 | King et al. | 257/727 |
| 5,155,661 | 10/1992 | Nagesh et al. | 361/386 |
| 5,182,632 | 1/1993 | Bechtel et al. | 257/713 |
| 5,189,505 | 2/1993 | Bartelink | 257/419 |
| 5,371,652 | 12/1994 | Clemens et al. | 257/727 |
| 5,408,190 | 4/1995 | Wood et al. | 324/765 |
| 5,440,241 | 8/1995 | King et al. | 324/765 |
| 5,483,741 | 1/1996 | Akram et al. | 29/846 |
| 5,519,332 | 5/1996 | Wood et al. | 324/755 |
| 5,539,324 | 7/1996 | Wood et al. | 324/758 |
| 5,541,525 | 7/1996 | Wood et al. | 324/755 |
| 5,559,444 | 9/1996 | Farnworth et al. | 324/754 |
| 5,578,526 | 11/1996 | Akram et al. | 437/209 |
| 5,634,267 | 6/1997 | Farnworth et al. | 29/840 |

Primary Examiner—Tom Thomas
Assistant Examiner—Alexander Oscar Williams
Attorney, Agent, or Firm—Stephen A. Gratton

[57] ABSTRACT

An improved multi chip module (MCM) and a method for forming the multi chip module are provided. The multi chip module includes a semiconductor wafer and an interconnect substrate having contact members adapted to establish electrical communication with dice contained on the wafer. The contact members can be formed as etched pillars with penetrating projections or as microbumps on a flexible tape. An alignment plate associated with the interconnect substrate includes an alignment opening adapted to mechanically align bond pads, or other contact locations, on the wafer with the contact members on the interconnect substrate. The multi chip module also includes a force applying member in the form of a compressible bladder or elastomeric member, adapted to press the wafer against the interconnect substrate. In an alternate embodiment, the multi chip module includes tested singulated dice and the alignment plate includes multiple alignment openings.

36 Claims, 4 Drawing Sheets

MULTI CHIP MODULE INCLUDING SEMICONDUCTOR WAFER OR DICE, INTERCONNECT SUBSTRATE, AND ALIGNMENT MEMBER

FIELD OF THE INVENTION

This invention relates generally to semiconductor packaging and particularly to the packaging of a semiconductor wafer or tested, singulated dice to form a multi chip module (MCM).

BACKGROUND OF THE INVENTION

A multi chip module (MCM) is a semiconductor package that includes bare semiconductor dice. Typically, the multi chip module includes an interconnect substrate for mounting and interconnecting the dice, and a housing for sealing and protecting the dice. The interconnect substrate can include contact members that establish electrical communication with bond pads or other contact locations on the dice. In addition, the interconnect substrate can include interconnect circuitry that provides an electrical path to the contact members and to input/output terminals for the module.

One contact technology that is utilized to establish electrical communication between the contact members on the interconnect substrate and the bond pads on the dice, is known as "flip chip bonding". With flip chip bonding, the dice are formed with raised bond pads having solder bumps. For forming a multi chip module, the dice are mounted face down to the interconnect substrate and the solder bumps are bonded to corresponding contact members on the interconnect substrate. Typically for flip chip bonding, the contact members on the interconnect substrate are flat metal pads.

One shortcoming of flip chip bonding is that the solder bumps and contact members on the substrate must have a minimum size and pitch to accommodate formation of a reliable electrical connection. In general, the dimensions of the bumps and contact members must be oversized to accommodate misalignment between the dice and substrate. Because of this requirement, the module must be formed with a relatively large surface area. Also the density of the dice can be limited by the large number of bond pads required by some dice.

In addition to density limitations, a temperature differential can develop between the dice and the interconnect substrate due to heat generated during operation of the integrated circuits formed on the dice. Since the solder bumps are constrained in the x, y and z directions, stress fractures can develop as a result of the temperature differential. The stress fractures can cause an unreliable electrical connection between the dice and substrate and can cause the mechanical bond between the dice and substrate to loosen.

Because of density and alignment limitations, alternate methods have been developed for forming multi chip modules. One prior art method of forming multi chip modules that does not utilize flip chip bonding is disclosed in U.S. Pat. No. 5,189,505 to Bartelink. This method includes forming contact members on the substrate comprising a post and a flexible membrane. Conductors formed on the substrate have one of their ends supported by the posts. Identical contact members are formed on the dice and can be bonded to the contact members on the substrate with a solder ball. This arrangement allows the posts and conductors to flex to accommodate misalignment between the substrate and dice. In general, this type of contact member is relatively complicated and requires an expensive and complex manufacturing procedure.

In view of the foregoing, a need exists for improved methods for constructing multi chip modules. In particular, a module is needed in which alignment can be effected between the dice and interconnect substrate even with a dense array of dice having a large number of closely spaced bond pads. In addition, the module must be able to accommodate a temperature differential between the dice and interconnect substrate without detriment to the electrical and mechanical connection therebetween.

SUMMARY OF THE INVENTION

In accordance with the invention, an improved multi chip module and a method for making the multi chip module are provided. The multi chip module, broadly stated, includes: a semiconductor wafer containing multiple semiconductor dice; an interconnect substrate having contact members adapted to establish an electrical connection to the dice; and an alignment plate for aligning the wafer and the interconnect substrate. The multi chip module also includes a sealed housing and a force applying member for biasing the wafer against the interconnect substrate. The force applying member can be formed as a compressible bladder or as a layer of an elastomeric material compressed within the housing.

The interconnect substrate can be formed of a semiconductor material, such as silicon, with etched contact members covered with a conductive layer. Alternately, the interconnect substrate can include microbump contact members formed on a flexible tape similar to multi layered TAB tape. In either case, the contact members on the interconnect substrate can be bonded to contact locations on the dice (e.g., bond pads) using heat, ultrasound or a conductive adhesive. In addition, conductors can be formed on the interconnect substrate in electrical communication with the contact members. The conductors can include contact pads that can be electrically connected to input/output terminals on the housing by wire bonding, or using mechanical-electrical connectors.

The alignment plate can also be formed of a semiconductor material such as silicon. The alignment plate includes an etched alignment opening for aligning the wafer with the interconnect substrate. Additionally, etched alignment members on the alignment plate and interconnect substrate can be provided for aligning the alignment plate with the interconnect substrate.

In an alternate embodiment, singulated dice rather than an entire wafer are used to construct the multi chip module. In the alternate embodiment, the alignment plate includes a plurality of alignment openings for aligning the singulated dice with corresponding contact members on the interconnect substrate. The singulated dice preferably have been tested and certified as known good dice (KGD). Furthermore, the singulated dice can be in bare form or can be contained in chip scale packages.

DETAILED DESCRIPTION OF THE PREFERRED EMBODIMENT

Figure 1:
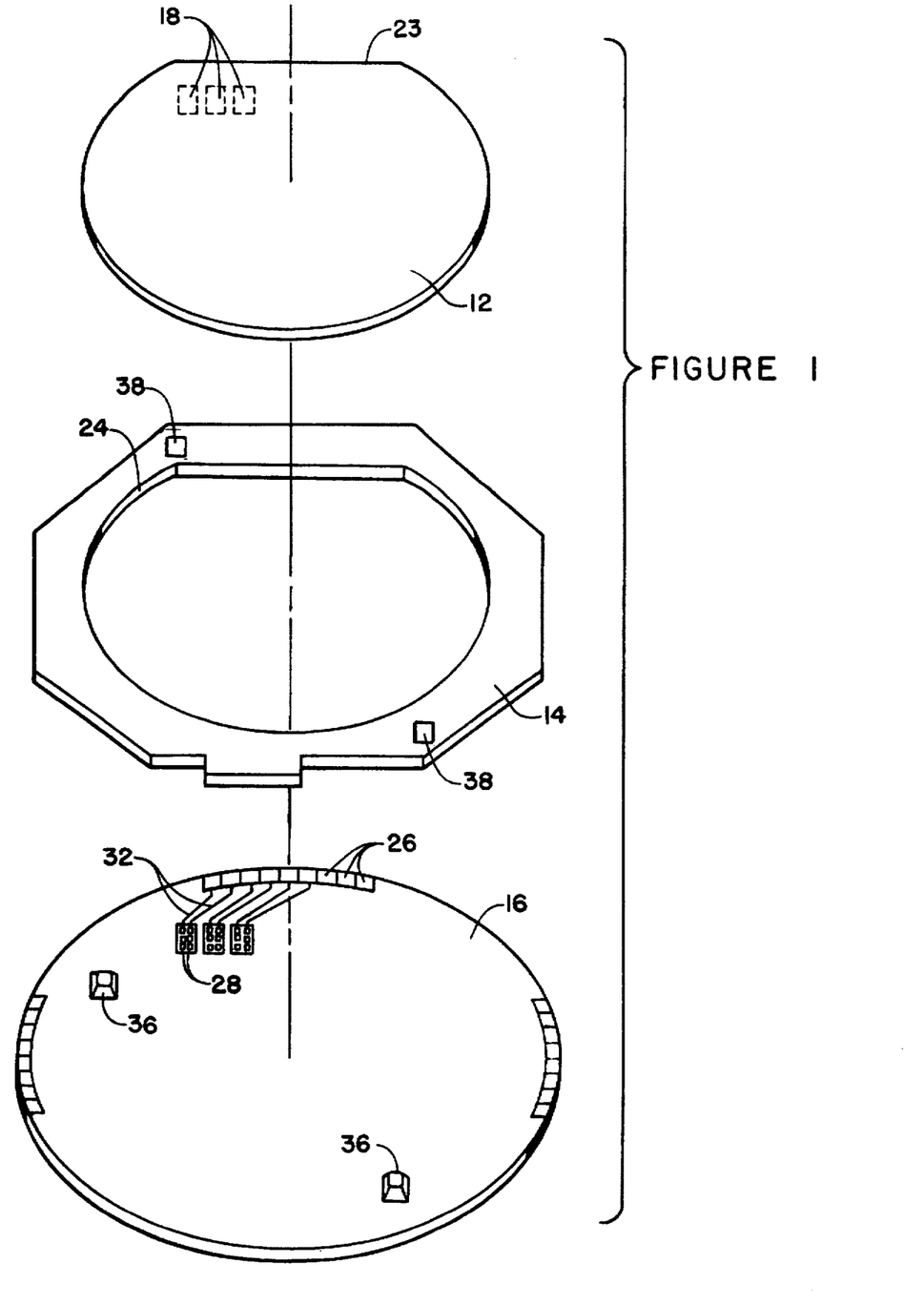
FIG. 1 is a schematic perspective view illustrating components of a multi chip module constructed in accordance with the invention.
Figure 2:
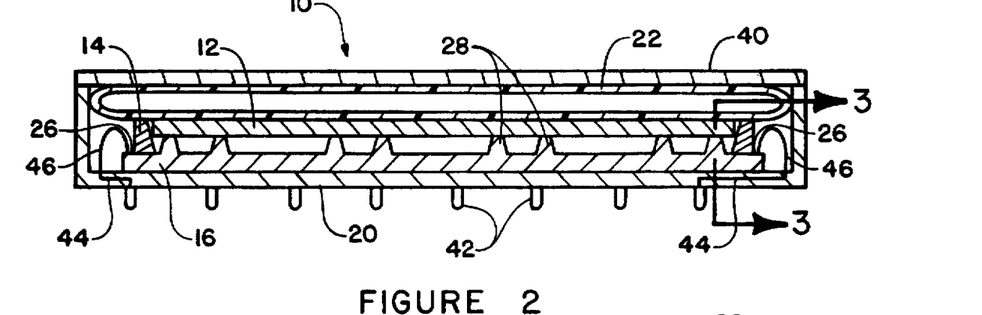
FIG. 2 is a schematic cross sectional view of a multi chip module constructed in accordance with the invention.

Referring to FIGS. 1 and 2, a multi chip module 10 (FIG. 2) constructed in accordance with the invention is shown. The multi chip module 10 comprises an assembly that includes a semiconductor wafer 12, an alignment plate 14, and an interconnect substrate 16. As shown in FIG. 2, the multi chip module 10 also includes a housing 20 and a force applying member 22.

The semiconductor wafer 12 is mounted circuit side down and includes a plurality of semiconductor dice 18. The interconnect substrate 16 is adapted to establish electrical communication with the dice 18 on the wafer 12. The alignment plate 14 is adapted to align the wafer 12 with the interconnect substrate 16.

The semiconductor wafer 12 can be a standard wafer having identical semiconductor dice 18. Alternately, some of the dice 18 can be configured to perform a desired circuit function (e.g., memory) while other dice are configured to perform a different function (e.g., address). By forming the multi chip module 10 with an entire semiconductor wafer 12, a dense array of dice 18 can be provided. The wafer 12 can also be provided with a standard outline and thickness and one or more flats 23. Alternately, the wafer 12 can be thinned from its backside using a planarization process such as chemical mechanical planarization (CMP) or etching. By thinning the wafer 12, the multi chip module 10 can be formed with a reduced thickness. A representative thickness for the wafer 12 can be from 4 to 28.5 mils.

The alignment plate 14 includes an alignment opening 24 having a peripheral outline that corresponds to the peripheral outline of the wafer 12. The peripheral size of the alignment opening 24 is slightly larger than the peripheral size of the semiconductor wafer 12. Preferably, the alignment opening 24 has a diameter that is only about 5 to 25 μm larger than the diameter of the wafer 12. In the assembled multi chip module 10 this tight tolerance helps to provide a close x and y direction registration between the wafer 12 and the interconnect substrate 16.

The alignment plate 14 can be formed of a semiconductor material, such as silicon, or of a material such as ceramic, or silicon nitride, having a coefficient of thermal expansion (CTE) that is close to the CTE of the semiconductor wafer 12. In addition, as will be further explained, with the alignment plate 14 formed of silicon, the alignment opening 24 can be formed using an etching process. In addition, by using an anisotropic etch process to form the alignment opening 24, the sidewalls of the opening will be sloped or tapered to facilitate guiding the wafer 12 into alignment with the interconnect substrate 16.

The alignment plate 14 can be formed with a multi-sided peripheral outline that is smaller than the outer circumference of the interconnect substrate 16. In the assembled multi chip module 10 (FIG. 2), the smaller outline of the alignment plate 14 permits access to contact pads 26 formed along the periphery of the interconnect substrate 16. As will be further explained, the contact pads 26 are configured for making an electrical connection between the housing 20 and the interconnect substrate 16.

Still referring to FIG. 1, the interconnect substrate 16 includes a plurality of contact members 28. The contact members 28 are formed on the interconnect substrate 16 in patterns that match the patterns of the bond pads 30 (FIG. 3) on the semiconductor dice 18. In addition, the contact members 28 are in electrical communication with conductors 32 formed on the interconnect substrate 16. The conductors 32 are in electrical communication with the contact pads 26. During assembly of the multi chip module 10, electrical paths such as wire bonds are formed between the contact pads 26 on the interconnect substrate 16 and input/output terminals 42 (FIG. 2) on the housing 20.

The contact members 28 can also include penetrating projections 34 (FIG. 3) adapted to penetrate into the bond pads 30 (FIG. 3) on the dice 18 to a self limiting penetration depth. As will be further explained, the contact members 28 and penetrating projections 34 can be formed integrally with the interconnect substrate 16 using an etching process. Such a process permits the contact members 28 to be formed accurately in a dense array.

As shown in FIG. 1, the interconnect substrate 16 can also include two or more alignment posts 36 that mate with corresponding alignment pockets 38 in the alignment plate 14. In the assembled multi chip module 10 (FIG. 2), the alignment posts 36 and alignment pockets 38 align the alignment plate 14 with the interconnect substrate 16. The alignment posts 36 and alignment pockets 38 can be formed with tolerances as previously specified that insure a tight x and y registration between the interconnect substrate 16 and the alignment plate 14.

As shown in FIG. 2, the housing 20 of the multi chip module 10 is a container adapted to contain the interconnect substrate 16, alignment plate 14 and wafer 12. In the assembled multi chip module 10, the interconnect substrate 20 mounts to the bottom surface of the housing 20 and the alignment plate 14 mounts to the interconnect substrate 14. If desired, the alignment plate 14 can be attached to the interconnect substrate 16 using a suitable adhesive.

The housing 20 can be formed of a material, such as plastic, molded into the desired size and shape. The housing 20 can also be formed of laminated ceramic or other insulating material formed in the desired size and shape. A cover 40 can be sealingly attached to the housing 20 to provide a sealable container.

As previously stated, the housing 20 includes a plurality of input/output terminals 42. The input/output terminals 42 are in electrical communication with conductive traces 44 formed within the housing 20. The conductive traces 44 can be formed using techniques that are known in the art such as 3D molding or metallization. The conductive traces 44 are configured for electrical connection to the contact pads 26 on the interconnect substrate 16. This electrical connection can be formed by wire bonding bond wires 46 to the conductive traces 44 and to the contact pads 26. Alternately, mechanical-electrical connectors 48 (FIG. 3) such as spring clips or slide connectors can be used to establish electrical communication between the conductive traces 44 and input/ output terminals 42 on the housing 20, and the contact pads 26 for the interconnect substrate 16. As yet another alternative, a conductive elastomer, such as a z-axis strip (i.e., z-strip) can be used to form an electrical path. Additionally, TAB tape in electrical contact with the contact pads 26 on the interconnect substrate 16 and with the conductive traces 44 on the housing can be used to form the electrical path.

In the assembled multi chip module 10, the wafer 12 is aligned with the interconnect substrate 16 by the alignment plate 14. In addition, the force applying member 22 is compressed within the housing 20 and is adapted to press the wafer 12 against the interconnect substrate 16. The force applying member 22 can be formed as a compressible bladder. This type of compressible bladder is available from Paratech of Frankfort, Ill. under the trademark "MAXI FORCE AIR BAG". Alternately the force applying member 22A (FIG. 6) can be formed of a resilient elastomeric material such as silicone, butyl rubber, or fluorosilicone; in foam, gel, solid or molded configurations. Suitable elastomeric materials include "PORON" available from Rogers or "BISCO" available from a Dow Chemical subsidiary. The force applying member 22 can also be formed as a metal or plastic spring member such as a wave spring, leaf spring, bellview washer or compression spring.

In FIG. 2 the contact members 28 on the interconnect substrate 16 are illustrated schematically with a larger than actual size. However, as will be further explained, the contact members have a height of only about 1–100 μm and would not be visible without a magnifying lens.

Figures 3, 3A, 4:
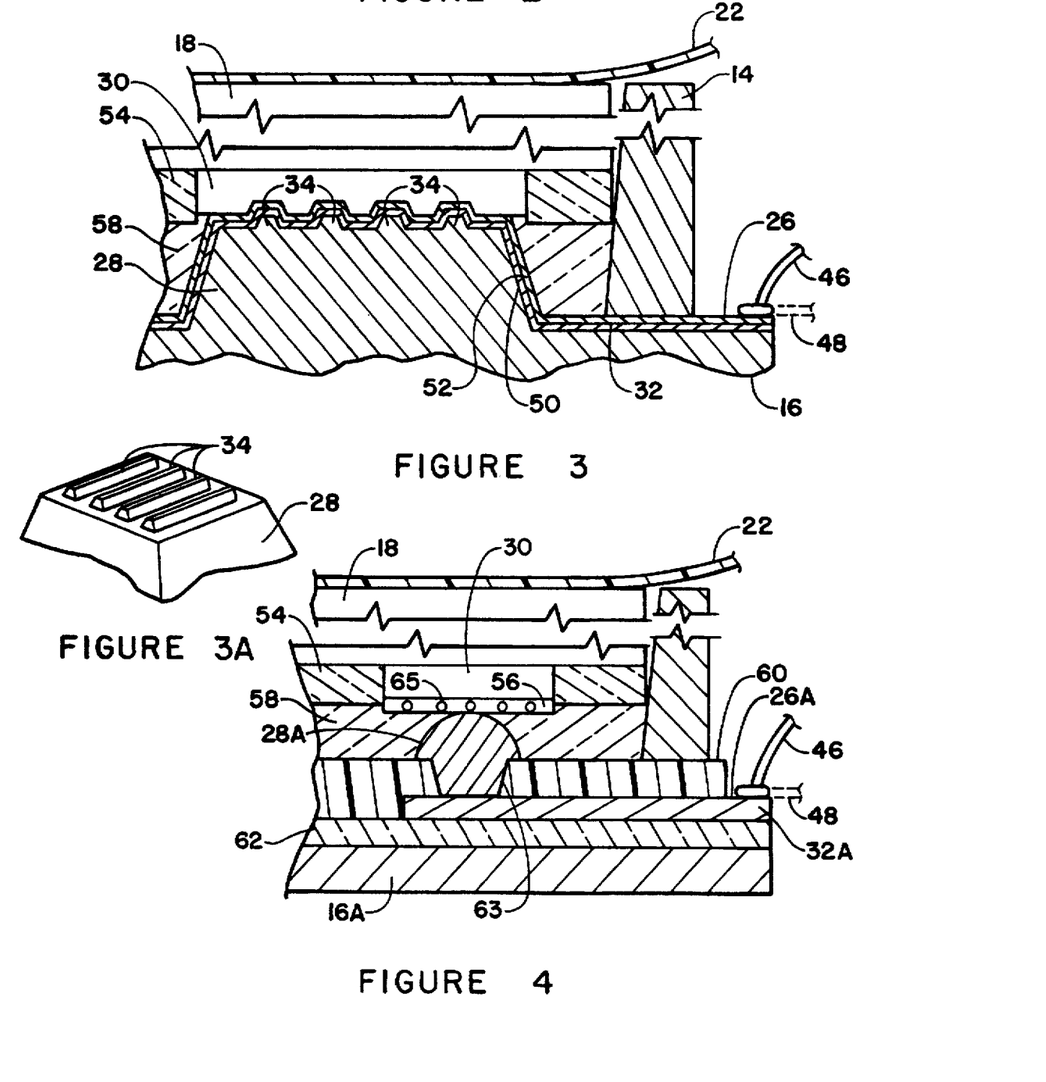
FIG. 3 is an enlarged cross sectional view taken along section line 3—3 of FIG. 2 illustrating a contact member for the multi chip module shown in FIG. 2 and its electrical connection to a bond pad on a semiconductor die.
FIG. 3A is a perspective view of a portion of FIG. 3 illustrating the contact member.
FIG. 4 is an enlarged cross sectional view equivalent to FIG. 3 of an alternate embodiment contact member for the multi chip module shown in FIG. 2.

Referring to FIG. 3, the electrical connection between the contact members 28 on the interconnect substrate 16 and the bond pads 30 on the dice 18 is shown. Each contact member 28 includes an insulating layer 50 and a conductive layer 52. As will be further explained, with the interconnect substrate 16 formed of silicon, the insulating layer 50 can be a grown or deposited oxide such as $SiO_2$.

The conductive layer 52 can be formed of a metal that can be readily bonded to the bond pads 30 on the dice 18. The bond pads 30 are typically formed of a thin layer of aluminum embedded in a passivation layer 54. The conductive layer 52 can be formed of aluminum, copper, titanium, tungsten, tantalum, platinum, molybdenum, cobalt, nickel, gold, iridium or alloys of these metals. The conductive layer 52 can also be a metal silicide or a conductive material such as polysilicon. In addition, the conductive layer 52 can be formed as a bi-metal stack.

The conductive layer 52 can be formed using a metallization process including deposition (e.g., CVD), followed by photopatterning and etching. The conductive layer 52 for each contact member 28 is in electrical communication with a corresponding conductor 32 formed on the interconnect substrate 16. The conductive layer 52 and conductors 32 can be formed at the same time using the same metallization process. Alternately, the conductive layer 52 can be formed of a different metal using a separate metallization. The contact pads 26 for the conductors 32 can also be formed using the same or a different metallization process and can be formed with a wire bondable metallurgy.

Still referring to FIG. 3, with the force applying member 22 pressing against the wafer 12, the penetrating projections 34 of the contact members 28 penetrate into the bond pads 30 and pierce any native oxide present to establish an electrical connection. However, the penetration depth of the projections 34 is limited by the stop plane provided by the top surface of the contact member 28. This limited penetration depth helps to prevent damage to the bond pads 30. In addition, the separation provided by the raised contact members 28 helps to clear any particulate matter present between the wafer 12 and the interconnect substrate. As clearly shown in FIG. 3A, the penetrating projections 34 can be formed as elongated blades such that the current is spread out over a larger area. In addition, from one to several penetrating projections 34 can be formed on each contact member 28. Also, the penetrating projections 34 can be formed in a parallel spaced array as shown, or in different patterns (e.g., cross, circular, T-shape). For bond pads 30 that are bumped the contact members 28 can be formed as disclosed in U.S. Pat. No. 5,592,736, incorporated herein by reference.

The contact members 28 in addition to establishing an electrical connection to the bond pads 30 can also be used to mechanically bond the wafer 12 to the interconnect substrate 16. This mechanical bond can be formed by heat, ultrasound or with a conductive adhesive layer 56 (FIG. 4). For example, with the bond pads 30 formed of aluminum, the conductive layer 52 for the contact members 28 can also be formed of aluminum. The wafer 12 and interconnect substrate 16 can then be heated to a temperature of about 300° C. or less to soften the aluminum and form a permanent bond. Ultrasound can be applied utilizing an ultrasonic transducer to apply energy through the wafer 12 or alternately through the interconnect substrate 16.

A bond between the wafer 12 and interconnect substrate 16 can also be formed by filling the gap therebetween with an underfill layer 58. The underfill layer 58 can be an epoxy or an elastomeric material formed using a suitable formation process. For example, a thin layer of an underfill material can be dispensed into the gap between the wafer 12 and interconnect substrate 16 using techniques that are known in the art and then drawn into the gap by capillary action. One suitable underfill material is "HYSOL BRAND FP4520" sold by Dexter Electronic Materials.

Referring to FIG. 4, an alternate embodiment interconnect substrate 16A is illustrated. Interconnect substrate 16A includes microbump contact members 28A formed on a flexible tape 60. The flexible tape 60 can be formed of a plastic film material such as polyimide. The microbump contact members 28A are formed in vias 63 through the tape 60 and are in electrical communication with conductors 32A formed on the tape 60. The conductors 32A include exposed contact pads 26A that can be wire bonded to bond wires 46 or electrically attached to connectors 48 as previously described.

The microbump contact members 28A and tape 60 can be similar to multi layer TAB tape such as "ASMAT" manufactured by Nitto Denko. The tape 60 can be mounted to the interconnect substrate 16A, such as silicon, using a compliant adhesive layer 62. The compliant adhesive layer 62 can be formed of a silicone elastomer, an epoxy or a polyimide material. Methods for forming microbump contact members are described in U.S. Pat. No. 5,487,999 and U.S. patent application Ser. No. 08/617,283, incorporated herein by reference.

The microbump contact members 28A can be bonded to the bond pads 30 on the dice 18 using a conductive adhesive layer 56. One type of anisotropic adhesive suitable for forming the conductive adhesive layer 56 is known as a "z-axis anisotropic adhesive". Z-axis anisotropic adhesives are filled with conductive particles 65 to a low level such that the particles 65 do not contact each other in the xy plane. Compression of the material in the z direction establishes an electrical path.

Z-axis anisotropic adhesives can be formed as a viscous paste or as a film that is applied and then cured to harden. Both types of z-axis anisotropic adhesives (paste or film) come in a thermal plastic or thermal setting variety. Thermal plastic anisotropic adhesives are heated to soften for use and then cooled for curing. Thermal setting anisotropic adhesives require heat curing at temperatures from 100°–300° C. for from several minutes to an hour or more. Suitable z-axis anisotropic adhesives are sold under the trademarks: "X-POLY" and "Z-POXY", by A. I. Technology, Trenton, N.J.; and "SHELL-ZAC", by Sheldahl, Northfield, Minn. Z-axis anisotropic adhesives are also sold by 3M, St. Paul, Minn.

The conductive adhesive layer 56 can be formed by blanket deposition of the anisotropic adhesive onto either the interconnect substrate 16A or the wafer 12 using a suitable dispensing process. Alternately, the conductive adhesive layer 56 can be deposited by stenciling or other suitable process to cover selected areas, such as the microbump contact members 28A or the bond pads 30. Once cured, the conductive adhesive layer 56 secures the bond pads 30 on the dice 18 to the microbump contact members 28A on the interconnect substrate 16A in electrical communication therewith. After formation of the conductive adhesive layer 56, an underfill layer 58 can be formed as previously described.

Alternately in place of the conductive adhesive layer 56, the microbump contact members 28A can be bonded to the bond pads 30 using heat or ultrasound as previously described. The contact members 28 shown in FIG. 3 can also be bonded to the bond pads 30 using a conductive adhesive layer as described above.

Figure 5:
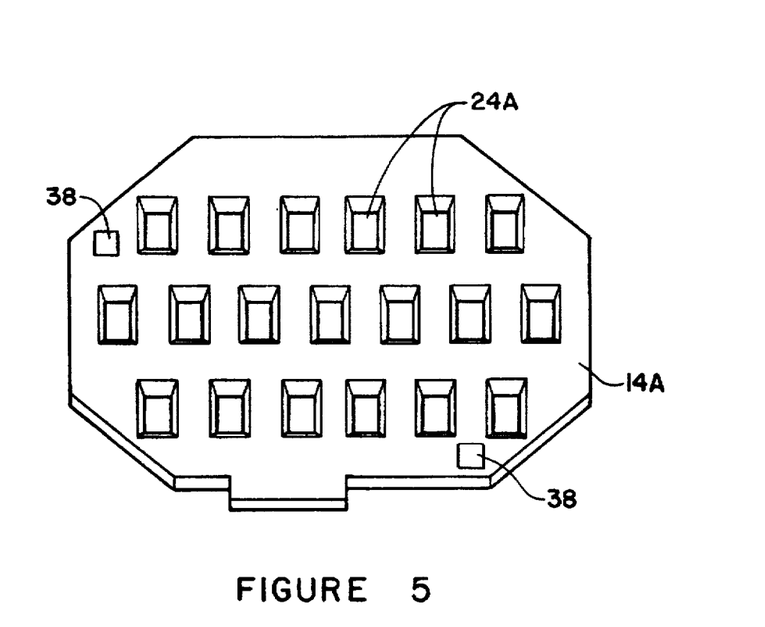
FIG. 5 is a schematic perspective view illustrating an alternate embodiment alignment plate for an alternate embodiment multi chip module.
Figure 6:
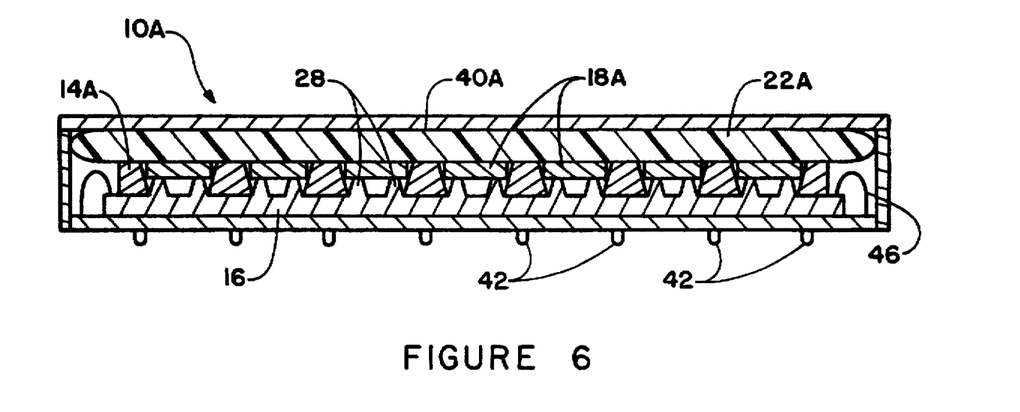
FIG. 6 is a schematic cross sectional view of the alternate embodiment multi chip module.

Referring to FIGS. 5 and 6, an alternate embodiment multi chip module 10A is shown. Multi chip module 10A uses singulated dice 18A rather than an entire semiconductor wafer. Preferably each singulated die 18A has been tested and certified as a known good die (KGD). The dice 18A can be bare dice or chip scale packages. Chip scale semiconductor packages can include thin protective covers formed of glass or other materials bonded to the face and backside of a bare die. An outline of a chip scale package is substantially equivalent to a bare semiconductor die.

The multi chip module 10A includes an alignment plate 14A having multiple alignment openings 24A for aligning the singulated dice 18A. Additionally, the multi chip module 10A can include the interconnect substrate 16 formed with contact members 28 or the interconnect substrate 16A formed with microbump contact members 28A. The multi chip module 10A is otherwise constructed substantially similar to the multi chip module 10 previously described.

The force applying member 22A for the multi chip module 10A can be formed as previously described as a compressible bladder or of a resilient elastomeric material such as silicone, butyl rubber, or fluorosilicone; in foam, gel, solid or molded configurations. In either case, the force applying member 22A can be formed with a thickness that allows it to be compressed by the cover 40A to press the singulated dice 18A against the contact members 28 on the interconnect substrate 16.

Figure 7A:
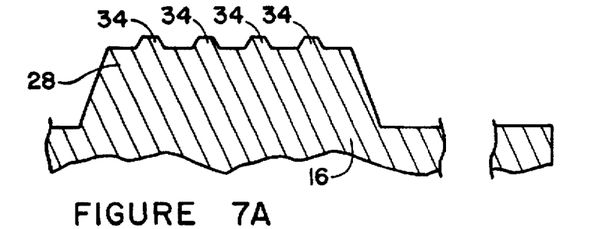
FIGS. 7A–7D are schematic cross sectional views illustrating process steps in forming a contact member for the multi chip module of FIG. 2.
Figure 7B:
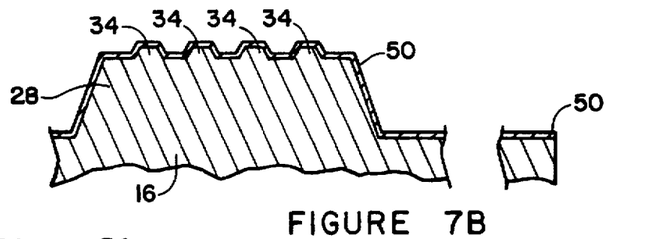

Referring to FIGS. 7A–7B, a process for forming the contact members 28 for an interconnect substrate 16 formed of silicon or other etchable semiconductor material is shown. Initially, as shown in FIG. 7A, the projections 34 can be formed by forming a mask (not shown) on the substrate 16 and then etching the substrate 16 through the mask. For example, a hard mask can be formed on the substrate 16 by depositing a layer of silicon nitride ($Si_3N_4$) and then patterning the silicon nitride layer using hot phosphoric acid. A wet or dry, isotropic or anisotropic, etch process can then be used to etch through openings in the hard mask to form the projections 34. For example, an anisotropic etch can be performed on a substrate 16 formed of silicon using a solution of KOH and $H_2O$.

The projections 34 can be elongated blades or sharp points formed in locations that match the placement of the bond pads 30 (FIG. 3) on the dice 18. In the illustrative embodiment, there are four projections 34 per contact member 28. However, a greater or lesser number can be formed. In addition, the projections 34 for each contact member 28 are formed in a pattern having an outline contained within the perimeter of the bond pads 30 (FIG. 3) on the dice 18. A representative height for the projections 34 measured from the base to the tip can be from 0.2 to 1 µm. A representative length for the projections 34 measured from end to end of the projections 34 can be from 3 to 10 µm.

Once the projections 34 are formed, the hard mask can be stripped and another mask (not shown) can be formed for etching the substrate 16 to form the contact members 28. Using an anisotropic etch process, the contact members 28 are formed as topographically elevated pillars generally conical in cross section. A representative height of the contact member 28 from base to tip can be from 50–100 µm. A representative width of each side of the contact member 28 can be from 40–80 µm. Following formation of the contact members 28, the etch mask can be stripped.

Suitable etch processes for forming the contact members 28 and projections 34 substantially as shown in FIG. 7A, are also disclosed in U.S. Pat. Nos. 5,326,428; 5,419,807 and 5,483,741 which are incorporated herein by reference.

Referring to FIG. 7B, once the projections 34 and contact members 28 are formed, the insulating layer 50 can be formed over the entire substrate 16. The insulating layer 50 can be a grown or deposited material such as $SiO_2$ or $Si_3N_4$. A representative thickness for the insulating layer 50 can be from 500 Å to 1 µm.

Figure 7C:
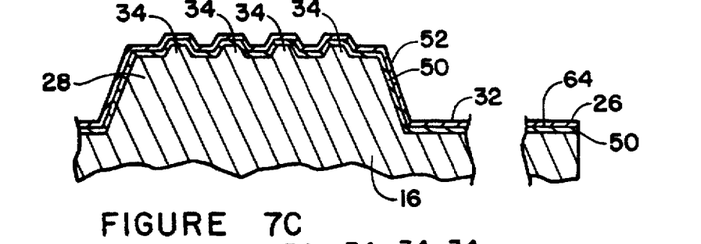

Next as shown in FIG. 7C, the conductive layer 52 for the contact members 28 is formed on the insulating layer 50. To form the conductive layer 52, a highly conductive metal can be blanket deposited on the substrate 16 by sputtering or other deposition process. Exemplary metals include aluminum, platinum, palladium, copper, gold and silver or alloys of these metals. A representative thickness for the conductive layer 52 can be from 500 Å to 2 µm.

Following blanket deposition of the conductive layer 52, a resist mask can be formed and used for etching the conductive layer 52 such that the contact members 28 remain covered with the conductive layer 52. The resist mask can be deposited using a standard photoresist deposition and exposure process. This can include spin deposition, followed by hardening, exposure and development. U.S. Pat. No. 5,607,818, incorporated herein by reference describes a method for patterning a conductive layer using an electrophoretically deposited layer of resist.

As an alternative to a metallization process (i.e., deposition, mask formation, etching), the conductive layer 52 can be formed as a metal silicide using a process as disclosed in U.S. Pat. No. 5,483,741 incorporated herein by reference.

During formation of the conductive layer 52, the conductors 32 and contact pads 26 can also be formed in electrical communication with the conductive layer 52 using the same material and metallization process used to form the conductive layer 52. Alternately the conductors 32 and contact pads 26 can be formed using different materials and a separate metallization process. For example, the conductors 32 and contact pads 26 can be formed using a process such as plating, thin film deposition or screen printing.

The contact pads 26 for the conductors 32 can be formed of a highly conductive material that is suitable for wire bonding. Preferred materials include gold and aluminum. The conductors 32 and contact pads 26 can also be formed of alloys of these metals or as stacks of these and other metals.

Figure 7D:
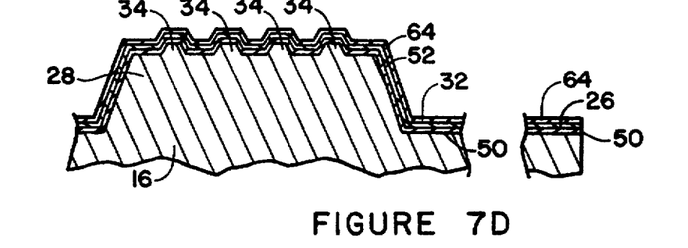

Following formation of the conductive layer 52 and as shown in FIG. 7D, a non-oxidizing cap layer 64 can optionally be formed on the conductive layer 52. The cap layer 64 can be formed by a suitable metallization or plating process. One purpose of the cap layer 64 is to prevent oxidation such that the electrical connection between the conductive layer 52 and the conductive adhesive layer 56 (FIG. 4) is not inhibited by a metal oxide. Suitable materials for the cap layer 64 include palladium, gold, tungsten and platinum. Alloys of these metals such as gold-platinum, silver-palladium, silver-platinum and palladium-gold can also be utilized to form the cap layer 64. A representative thickness for the cap layer 64 can be from 200 Å to 2 μm.

One method of forming the cap layer 64 out of palladium or gold is by electroless plating. With electroless plating, an aqueous solution comprising metal ions and reducing agents is used. Compositions for these solutions for different metals are known in the art. If desired, the conductors 32 and the contact pads 26 can also be covered with a cap layer using the same deposition process.

Figure 8A:
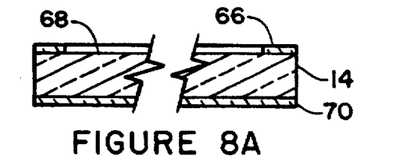
FIGS. 8A–8D are schematic cross sectional views illustrating process steps in forming the alignment plate for the multi chip module of FIG. 2.

Referring to FIGS. 8A–8D, steps in a method for forming the alignment plate 14 (or 14A) is shown. The alignment plate 14 (or 14A) can be formed of silicon or other etchable semiconductor material. Initially, as shown in FIG. 8A a hard mask 66 is formed. The hard mask can be formed of a material such as silicon nitride ($Si_3N_4$), that is initially deposited to a thickness of about 500 Å to 3000 Å using a suitable deposition process such as CVD. This material is then photopatterned and etched. The hard mask 66 includes an opening 68 for etching the alignment opening 24 (FIG. 8B) or in the case of the alignment plate 14A multiple openings for forming multiple alignment openings 24A (FIG. 5). An etch stop layer 70 preferably of a same material as the hard mask 66 is also formed.

Figure 8B:
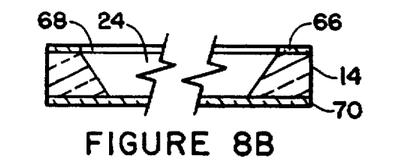

Next, as shown in FIG. 8B, an etch process is used to form the alignment opening 24. Typical etching techniques comprise wet anisotropic etching with a mixture of $KOH:H_2O$. This type of etching is also known in the art as bulk micro-machining. With an anisotropic etch the sidewalls of the alignment opening 24 will be sloped at an angle of about 54° with the horizontal. This provides a beveled surface that facilitates alignment of the wafer 12. The alignment opening is etched through the full thickness of the alignment plate 14 using the etch stop layer 70 as an end point.

Figure 8C:
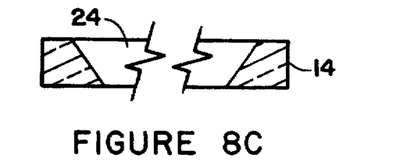

Next, as shown in FIG. 8C, the hard mask 66 and etch stop layer 70 are removed. For a hard mask 66 and etch stop layer 70 formed of silicon nitride an etchant, such as $H_3PO_4$ can be used for removal.

Figure 8D:
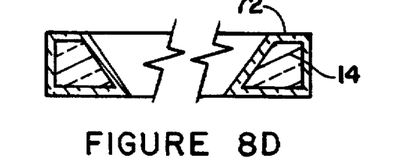

Next, as shown in FIG. 8D, an insulating layer 72 is formed on all exposed surfaces of the alignment plate 14. The insulating layer 72 can be an oxide such as $SiO_2$ formed using a growth or deposition process. The insulating layer 72 electrically insulates the alignment plate 14 from other components in the assembled multi chip module 10.

Thus the invention provides an improved multi chip module and method of fabrication. While the invention has been described with reference to certain preferred embodiments, as will be apparent to those skilled in the art, certain changes and modifications can be made without departing from the scope of the invention as defined by the following claims.

What is claimed is:

1. A multi chip module comprising:
   a semiconductor wafer;
   a substrate having a plurality of contact members;
   a silicon alignment plate with an etched opening configured to align the wafer with the substrate; and
   a force applying member for biasing the wafer against the substrate with the contact members on the substrate in electrical communication with contact locations on the wafer.

2. The module as claimed in claim 1 further comprising a housing for retaining the wafer, the substrate, the alignment plate and the force applying member.

3. A multi chip module comprising:
   a semiconductor wafer;
   a substrate having a plurality of contact members;
   an alignment plate configured to align the wafer with the substrate; and
   a compressible bladder for biasing the wafer against the substrate with the contact members on the substrate in electrical communication with contact locations on the wafer.

4. A multi chip module comprising:
   a semiconductor wafer having a plurality of contact locations thereon;
   a substrate having a plurality of contact members thereon, each contact member comprising at least one projection adapted to penetrate a respective contact location to a limited penetration depth;
   an alignment plate configured to align the contact members with the contact locations; and
   a force applying member for biasing the wafer against the substrate.

5. The module as claimed in claim 4 wherein the contact members comprise conductive layers bonded to the contact locations.

6. The module as claimed in claim 4 further comprising a plurality of conductive adhesive layers formed between the contact members and contact locations.

7. The module as claimed in claim 4 further comprising a housing configured to retain the wafer and substrate, the housing comprising terminals in electrical communication with the contact members.

8. A multi chip module comprising:
   a plurality of semiconductor dice having a plurality of contact locations thereon;
   a substrate comprising a plurality of contact members configured to establish electrical communication with the contact locations on the dice;
   a plurality of conductive adhesive layers bonding and electrically connecting the contact members to the contact locations;
   an alignment plate including a plurality of alignment openings with the dice placed therein in alignment with the contact members; and
   a force applying member for biasing the dice against the substrate.

9. The module as claimed in claim 8 further comprising a sealed housing for containing the dice, the substrate, the alignment plate and the force applying member.

10. The module as claimed in claim 8 wherein the dice comprise chip scale packages.

11. The module as claimed in claim 8 wherein the contact members comprise etched pillars covered with conductive layers.

12. A multi chip module comprising:
a plurality of semiconductor dice comprising a plurality of contact locations;
a substrate comprising a plurality of contact members configured to establish electrical communication with the contact locations on the dice;
an alignment plate comprising a plurality of alignment openings with the dice placed therein in alignment with the contact members; and
a compressible bladder for biasing the dice against the substrate.

13. The module as claimed in claim 12 wherein the contact members comprise bumps formed on tape attached to the substrate.

14. A multi chip module comprising:
a housing comprising a plurality of input/output terminals;
a substrate mounted to the housing comprising a plurality of contact members in electrical communication with the terminals, the contact members comprising microbumps mounted to a flexible tape attached to the substrate;
an alignment plate attached to the housing in alignment with the substrate and including an alignment opening;
a semiconductor wafer placed through the opening against the substrate with contact locations on the wafer in electrical communication with the contact members on the substrate.

15. The module as claimed in claim 14 further comprising a force applying member for biasing the wafer against the substrate.

16. The module as claimed in claim 14 wherein the contact members are bonded to the contact locations.

17. A multi chip module comprising:
a housing comprising a plurality of input/output terminals:
a substrate mounted to the housing, the substrate comprising a plurality of contact members in electrical communication with the terminals;
an alignment plate on the housing and including an alignment opening; and
a semiconductor wafer comprising a plurality of contact locations, the wafer placed through the opening and against the substrate with the contact members bonded to the contact locations with a conductive adhesive.

18. A multi chip module comprising:
a housing comprising a plurality of input/output terminals;
a substrate mounted to the housing, the substrate comprising a plurality of contact members in electrical communication with the terminals, the contact members comprising etched members covered with conductive layers;
an alignment plate on the housing and including an alignment opening; and
a semiconductor wafer comprising a plurality of contact locations, the wafer placed through the opening and against the substrate with the contact members in electrical communication with the contact locations.

19. The module as claimed in claim 18 wherein the alignment plate comprises silicon.

20. The module as claimed in claim 18 wherein the contact members are bonded to the contact locations with conductive adhesive layers.

21. A multi chip module comprising:
a housing comprising a plurality of input/output terminals;
a substrate mounted to the housing comprising a plurality of contact members in electrical communication with the terminals;
an alignment plate mounted to the housing in alignment with the substrate and including a plurality of alignment openings;
a plurality of semiconductor dice placed through the openings such that contact locations on the dice are in electrical communication with the contact members on the substrate; and
a force applying member for biasing the dice against the substrate, the force applying member comprising a material selected from the group consisting of silicone, butyl rubber, and fluorosilicone.

22. The module as claimed in claim 21 wherein the dice comprise known good dice.

23. The module as claimed in claim 21 wherein the dice comprise chip scale packages.

24. The module as claimed in claim 21 wherein the contact members are bonded to the contact locations.

25. The module as claimed in claim 21 wherein the contact members comprise microbumps mounted to a flexible tape attached to the substrate.

26. An assembly comprising:
a housing comprising a plurality of input/output terminals;
a silicon substrate mounted to the housing and having a plurality of contact members comprising etched pillars covered with conductive layers in electrical communication with the terminals,
an alignment plate placed on the substrate having an alignment opening formed therethrough;
a semiconductor wafer placed through the alignment opening so that the contact members establish electrical communication with contact locations on the wafer;
a force applying member for biasing the wafer against the substrate.

27. The module as claimed in claim 26 wherein the wafer is thinned prior to being placed in the alignment opening.

28. The assembly as claimed in claim 26 further comprising a cover sealingly attached to the housing.

29. The assembly as claimed in claim 26 wherein the conductive layer is bonded to the contact locations.

30. An assembly comprising:
a housing comprising a plurality of input/output terminals;
a substrate mounted to the housing and having a plurality of contact members in electrical communication with the terminals, the contact members comprising microbumps mounted to a flexible tape attached to the substrate;
an alignment plate placed on the substrate having an alignment opening formed therethrough;
a semiconductor wafer placed through the alignment opening so that the contact members establish electrical communication with contact locations on the wafer;
a force applying member for biasing the wafer against the substrate.

31. The assembly as claimed in claim 30 wherein the contact members are attached to the contact locations using a conductive adhesive.

32. An assembly comprising:

a housing comprising a plurality of input/output terminals;

a substrate mounted to the housing and having a plurality of contact members in electrical communication with the terminals;

an alignment plate placed on the substrate having an alignment opening formed therethrough;

a semiconductor wafer placed through the alignment opening so that the contact members establish electrical communication with contact locations on the wafer;

a force applying member for biasing the wafer against the substrate; and an underfill layer formed in a gap between the substrate and wafer.

33. An assembly comprising:

a housing comprising a plurality of input/output terminals;

a substrate mounted to the housing, the housing comprising a plurality of contact members in electrical communication with the terminals, an alignment plate placed on the substrate having an a plurality of alignment openings formed therethrough;

a plurality of semiconductor dice placed through the alignment openings, each die comprising a plurality of contact locations;

a plurality of conductive adhesive layers bonding and electrically connecting the contact members on the substrate with the contact locations on the dice; and a force applying member for biasing the wafer against the substrate.

34. The assembly as claimed in claim 33 wherein the dice comprise tested known good dice.

35. The assembly as claimed in claim 33 wherein the dice comprise bare dice.

36. The assembly as claimed in claim 33 wherein the dice comprise chip scale packages.

* * * * *